United States Patent
Redford (10) Patent No.: US 8,204,090 B2
(45) Date of Patent: Jun. 19, 2012

(54) SCALABLE, RECONFIGURABLE, LASER COMBINER

(75) Inventor: Glen Ivan Redford, Arvada, CO (US)

(73) Assignee: Intelligent Imaging Innovations, Inc., Denver, CO (US)

( * ) Notice: Subject to any disclaimer, the term of this patent is extended or adjusted under 35 U.S.C. 154(b) by 150 days.

(21) Appl. No.: 12/821,397

(22) Filed: Jun. 23, 2010

(65) Prior Publication Data

US 2010/0260217 A1 Oct. 14, 2010

Related U.S. Application Data

(63) Continuation of application No. 12/263,536, filed on Nov. 3, 2008, now Pat. No. 7,760,776.

(60) Provisional application No. 60/984,971, filed on Nov. 2, 2007.

(51) Int. Cl.
*H01S 3/13* (2006.01)

(52) U.S. Cl. ............... 372/29.014; 372/23; 372/50.12; 372/107

(58) Field of Classification Search ............ 372/23, 372/29.014, 50.12
See application file for complete search history.

(56) References Cited

U.S. PATENT DOCUMENTS

| | | | |
|---|---|---|---|
| 7,160,287 B1 * | 1/2007 | Siegel | 606/3 |
| RE40,173 E | 3/2008 | Zediker et al. | |
| 7,697,207 B2 * | 4/2010 | Govorkov et al. | 359/618 |
| 7,760,776 B2 | 7/2010 | Redford | |

OTHER PUBLICATIONS

"Laser Combiner and Multi-Port Switch," Andor Technology plc., available at http://www.andor.com/microscopy_systems/peripherals/laser_combiners/, copyright 2008, printed Nov. 4, 2008, one page.
Heath, "Multi-wavelength laser combiner from Agilent," Microscopy and Analysis, available at http://www.microscopy-analysis.com/cgi-bin/item.cgi?id=878&d=pg_dtl_print&h=pg_hdr..., May 29, 2008, one page.
"Multi-Laser Combiner System," LSM Technologies, available at http://www.lsmtech.com/multilaser.html, printed Nov. 4, 2008, one page.
"iFlex3000—Laser Combiner Module," Point Source, available at http://www.point-source.com/lasercombiner.asp, printed Nov. 4, 2008, one page.
"Diode Lasers: Diode laser beam combiners," Princetel, Inc., available at http://www.princetel.com/dl_bc4.asp, copyright 2008, printed Nov. 4, 2008, one page.
"Laser Merge Module, model LMM5 Combine multiple laser wavelengths into a single fiber cable," Spectral Applied Research, available at http://www.spectral.ca.products/mergermodule/index.html, copyright 2005, printed Nov. 4, 2008, 3 pages.
Notice of Allowance for U.S. Appl. No. 12/263,536, mailed May 4, 2010.

* cited by examiner

*Primary Examiner* — Dung Nguyen
(74) *Attorney, Agent, or Firm* — Jason H. Vick; Sheridan Ross, PC (57) ABSTRACT

Modular electrical, mechanical and optical components allow for the building of a laser combiner system that can be used, for example, for biological research that allows different lasers to be easily added to or removed from a laser system. Each individual laser can be packaged into a module which can be added to or taken away from the laser system with relative ease. Each of the modules can be controlled via a control module that allows one or more of varying of power levels, switching on/off, shutter control and diagnostic/status information monitoring.

29 Claims, 8 Drawing Sheets

SCALABLE, RECONFIGURABLE, LASER COMBINER

RELATED APPLICATION DATA

This application is a Continuation of U.S. application Ser. No. 12/263,536 filed Nov. 3, 2008, which claims the benefit of and priority under 35 U.S.C. §119(e) to U.S. Patent Application No. 60/984,971, filed Nov. 2, 2007, entitled "Scalable, Reconfigurable, Laser Combiner," each of which are incorporated herein by reference in their entirety.

BACKGROUND OF THE INVENTION

Lasers have become more widely used in most technical areas of research in commercial products. The recent introduction of solid-state laser modules that are much smaller and longer lasting than gas lasers has expanded the number and scope of laser applications. For example, in the bio-medical field, lasers are being increasingly used for imaging and diagnostics. A confocal microscope, for example, is usually used with a laser for imaging.

FIELD OF THE INVENTION

This invention generally relates to laser systems. More specifically, an exemplary embodiment of this invention relates to a modular, scalable, and reconfigurable laser combiner. Even more specifically, an exemplary embodiment of the invention relates to a modular, stackable laser combiner.

SUMMARY OF THE INVENTION

Most single, solid-state laser modules have only one wavelength output. Many applications require more than one laser at different wavelengths. In the example of the confocal microscope, having multiple available wavelengths allows multiple channel imaging for different contrast agents. A common way to combine laser beams is to use a polychromatic mirror (dichroic) to reflect one laser beam along the path of another. Typical applications of this sort require precise alignment of the two beams. In particular, if the output of the combined laser beams will be coupled into a fiber optic cable, the beams must be precisely aligned to each other and the fiber. Because of this, great care must be taken with issues such as mechanical stability, vibration isolation, and thermal expansion. A typical solution would have the lasers, combining optics and fiber on a single solid platform.

A single solid platform can solve the issues of stability, but for commercial systems it requires reconfiguration of the internal optics to change the system by adding a laser, for example. As lasers are expensive, often customers want to pick and choose the most appropriate wavelengths for their application which is not necessarily the standard commercial offering. This leads to a large number of customized systems.

In addition to simply combining laser beams, many applications require fast control of the output wavelengths and intensity. In particular, many applications require fast shuttering of the individual beams so that one or more of the available wavelengths can be selected as the output as well as general shuttering functionality, e.g., the ability to turn on/off all the lasers. Many applications also require a means to individually control the output intensity of the various beams. This can be done with mechanical shutters and neutral density filter wheels. This can also be accomplished with particular models of lasers by controlling the lasers directly with electrical signals or commands. For some past applications, acousto-optics were used to simultaneously control the wavelengths and intensity of the beams.

Accordingly, one exemplary embodiment of the invention is directed toward a modular electrical, mechanical and optical system for building a laser combiner system that can be used, for example, for biological research that allows different lasers to be easily combined and recombined into a complete system. Each individual laser can be packaged into a module which can be added to or taken away from a complete system with relative ease. This aids manufacturing, because a laser can be built into a module without necessarily requiring the complete system. The individual modules can be quickly combined into a complete system thereby also enabling easily field-upgradeable systems.

One laser combiner system uses between one and six lasers to form about 62 different optional combinations. This results in a large number of possible configurations, which makes each system essentially custom. With this typical laser combiner system, all the lasers that go in the system and all the optics are required to begin production of the system. Upgrading this system by, for example, adding a laser, usually requires remanufacture of the whole system, and at least is very difficult to do in the field.

In accordance with an exemplary embodiment of the present invention, each laser option is built into a separate module that can be "stacked" with other modules to form a combined laser. Each exemplary module comprises the laser, power supply, electronics and combiner optics. Individual modules can be held rigidly relative to all the other modules, with a mechanical (inter)locking system. In accordance with this exemplary embodiment, there is a top module, which goes on top of the stack of laser modules which handles the laser switching, control, shutter, etc. This means that instead of hundreds of possible laser combiner systems, there only needs to be seven different modules built for any possible configuration. Additional modules can handle extra features such as multiple output switching, high-speed modulation, laser scanning, and the like. Because this new module system is completely expandable, it is no longer limited to only six lasers. To field upgrade a system would only require inserting a new module into the stack.

Modules can preferably be stacked such that higher wavelength lasers are always below shorter wavelength lasers. Dichroics are used to combine beams. They are chosen such that the dichroic in a given module transmits any wavelengths higher than the wavelength of that module's laser. The desired output is controlled, for example, by a tunable filter or by shutters in front of the individual lasers.

Each module can also include one or more electrical connectors which receive input from the module above it and passes the input to the module below it. The inputs can include, for example, power, electrical control signals, laser safety signals, on/off signals and lights, and the like. A simple jumper system can allow the module to know which layer it is in the stack.

According to one exemplary embodiment of the present invention, there is provided an apparatus for packaging individual laser modules into a mechanical structure that can be combined with other such structures such that Individual laser modules are combined with beam alignment optics, combining optics, electronics, heat sinks, and mechanical and/or thermal stabilization into one mechanical unit (stack).

Stacks can be mechanically attached to other stacks to form a combined laser beam.

Stacks can be combined in any quantity as the availability of lasers and combining optics will allow.

Additional non-laser stacks can be placed between laser stacks or after laser-stacks to add required optics such as shutters or acousto-optics for controlling the laser beam intensities.

The final output of the combined beams can be aligned into a fiber optic or other optical system, e.g., free space, which moves the beam to where it is used. A mechanical structure that can be attached to the stacks holds said optical system.

The exemplary apparatus can comprise:

One or more laser modules with different wavelength outputs.
Means for steering the beams with respect to each other for alignment purposes.
Means for combining the different beams into a single beam.
Means for controlling the intensity of individual beams either by turning them off and on or by attenuating the beams or both.
Means for maintaining the alignment between the combined beam and the device that uses the combined beam.
Means for managing heat if the environment and laser modules require it.

An example system that would have three output wavelengths would have:
A stack with a 488 nm laser module.
A stack with a 561 nm laser module.
A stack with a 640 nm laser module.
A poly-chromatic acousto-optical modulator for controlling the beam intensities.
A fiber output.

In accordance with one exemplary embodiment, the connections made between stacks include:
1) mechanical (stable, alignment maintaining);
2) optical (usually dichroics [polychromatic beamsplitters], but could be prisms, acousto-optical beamsplitters, grating, polarized beamsplitter); and
3) electrical (unless the electronics are external to the stacks).
Optional connections include:
1) Thermal (air cooling, liquid cooling, thermo-electric cooling)
2) Laser safety (interlock system, shutter(s))
3) Access for aligning and maintenance without separating stacks
4) Laser "control" means (turning on/off rapidly specific laser lines, power control of individual lines) include:
   1) AOTF=acousto-optical tunable filter (also called PCAOM=poly chromatic acousto optical modulator)
   2) AOM=acousto optical modulator (usually one is needed for each laser line)
   3) Shutter (one for each laser, or one master shutter usually for laser safety)
   4) ND wheel=neutral density wheel (a mechanical way to control power intensity)
   5) Direct laser electronic control (some lasers may be controlled directly via external voltages/signals or via computer commands-for example, many diode lasers can be controlled this way)
   6) Pockel's cell (for very fast intensity control)
   7) Rotating waveplate and analyzer (one for each line, or for all lines)

Having a modular system such as this has the advantage that individual laser modules can be packaged into their stack and each such stack can be identical for the same model of laser. These pre-assembled stacks can then be combined in a relatively quick manner to form a complete laser system. The number of separate manufactured entities is now equal to the number of possible lasers instead of the number of possible laser combinations which is much greater. For example, if there are six appropriate lasers for a given field of interest, this invention would require the design and manufacture of six individual entities (plus those needed for intensity control) whereas a conventional means would require 62 possible entities. Another exemplary advantage is that a customer's laser system can be relatively easily upgraded by adding a laser.

When designing such a modular system great care must be taken with the mechanical design. The stacks must be able to attach to each other rigidly. Beam alignment must be maintained in the particular environment where the device will be used. This environment can include vibrations, motion and thermal shifts.

Because the system is designed to be flexible so that any number of beams can be added together, an appropriate way to combine the beams is to use long pass dichroics, such that the laser to be combined into the beam is reflected by the dichroic. All lasers of longer wavelength are transmitted. This requires the stacks be combined in order of wavelength.

Aspects of the invention are thus directed toward a laser system.

Still further aspects of the invention are directed toward a modular, scalable laser system.

Even further aspects of the invention are directed toward a modular, scalable laser combiner system.

Still further aspects of the invention are directed toward a control module working in cooperation with one or more laser modules.

Even further aspects of the invention are directed toward a plurality of stackable laser modules controlled by a controlled module which outputs a combined laser beam.

Still further aspects of the invention relate to mechanical alignment mechanism or a plurality of laser modules.

Even further aspects of the invention relate to a mechanical alignment mechanism for a plurality of laser modules and a control module.

Still further aspects of the invention relate to an apparatus for a combined laser system including:
one or more laser modules with different wavelength outputs;
means for steering the beams with respect to each other for alignment purposes;
means for combining the different beams into a single beam;
means for controlling the intensity of individual beams either by turning them off and on or by attenuating the beams or both;
means for maintaining the alignment between the combined beam and the device that uses the combined beam;
means for managing heat if the environment and laser modules require it (each laser module can be packaged into a mechanical entity with its necessary optics and electronics. These entities can then be mechanically combined into a complete system with combined laser beams);
mechanical means for rigidly attaching these entities together.

The aspect above, where the laser modules are solid-state laser modules.

The aspect above, where the means for steering the beam consists of mirrors in mechanically adjustable mounts.

The aspect above, where the means for controlling the intensities of individual lasers includes mechanical shutters for each laser.

The aspect above, where the means for controlling intensities includes neutral density filter wheels.

The aspect above, where a final mechanical shutter is used to block all outgoing laser beams.

The aspect above where the means for controlling intensities includes acousto-optical devices for each individual laser.

The aspect above, where the means for controlling intensities includes an acousto-optical device for multiple laser beams simultaneously.

The aspect above, where the acousto-optical device is a poly-chromatic acousto-optic modulator.

The aspect above, where the means for controlling intensities includes direct electronic control of the laser modules including electronic signaling or digital or serial commands via an interface.

The aspect above, where the means for controlling intensities is packaged into a separate mechanical entity that can be introduced between or after the laser entities.

The aspect above, where the output optics or fiber optic is mechanically attached to the end of the chain of laser entities.

The aspect above, where the individual laser entities of the combined may be combined or removed without requiring re-alignment of the system.

The aspect above, where the electrical signals required for the individual laser modules are routed through the system such that the entire system can be controlled with one interface (connector).

The aspect above, where the electrical power required for the individual laser modules are routed through the system such that the entire system can be powered with one input.

The aspect above, where an optical switching device is used to direct the output between 2 or more different output paths.

The aspect above, where the switching device contains a moving mirror.

These and other features and advantages of this invention are described and, or are apparent from, the following detailed description of the exemplary embodiment.

BRIEF DESCRIPTION OF THE DRAWINGS

The exemplary embodiments of the invention will be described in detail, with reference to the following figures wherein.

DETAILED DESCRIPTION OF THE INVENTION

The exemplary embodiments of this invention will be described in relation to lasers, laser systems, and associated components. However, it should be appreciated that, in general, known components will not be described in detail. For purposes of explanation, numerous details are set forth in order to provide a thorough understanding of the present invention. It should be appreciated however that the present invention may be practiced in a variety of ways beyond the specific details set forth herein.

Furthermore, while the exemplary embodiments illustrated herein show various components of the system collocated, it is to be appreciated that various components of the system can be rearranged within the laser system such as in one or more of the described modules. Thus, it should be appreciated that the components of the system can be combined into one or more modules, or rearranged without necessarily changing the underlying functionality. Additionally, while the stack is shown in a vertical orientation, it need not be vertically oriented and could be horizontal or in general in any orientation. Furthermore, it should be appreciated that various illustrated links, connecting the elements can be wired or wireless links, or any combination thereof, or any other known or later developed element(s) that is capable of supplying and/or communicating data and/or power to and from the connected elements. The term "module" as used herein can refer to any known or later developed hardware, software, firmware, or combination thereof that is capable of performing the functionality associated with that element. The terms "determine," "calculate" and "compute," and variations thereof, as used herein are used interchangeably and include any type of methodology, process, mathematical operation or technique.

Figure 1:
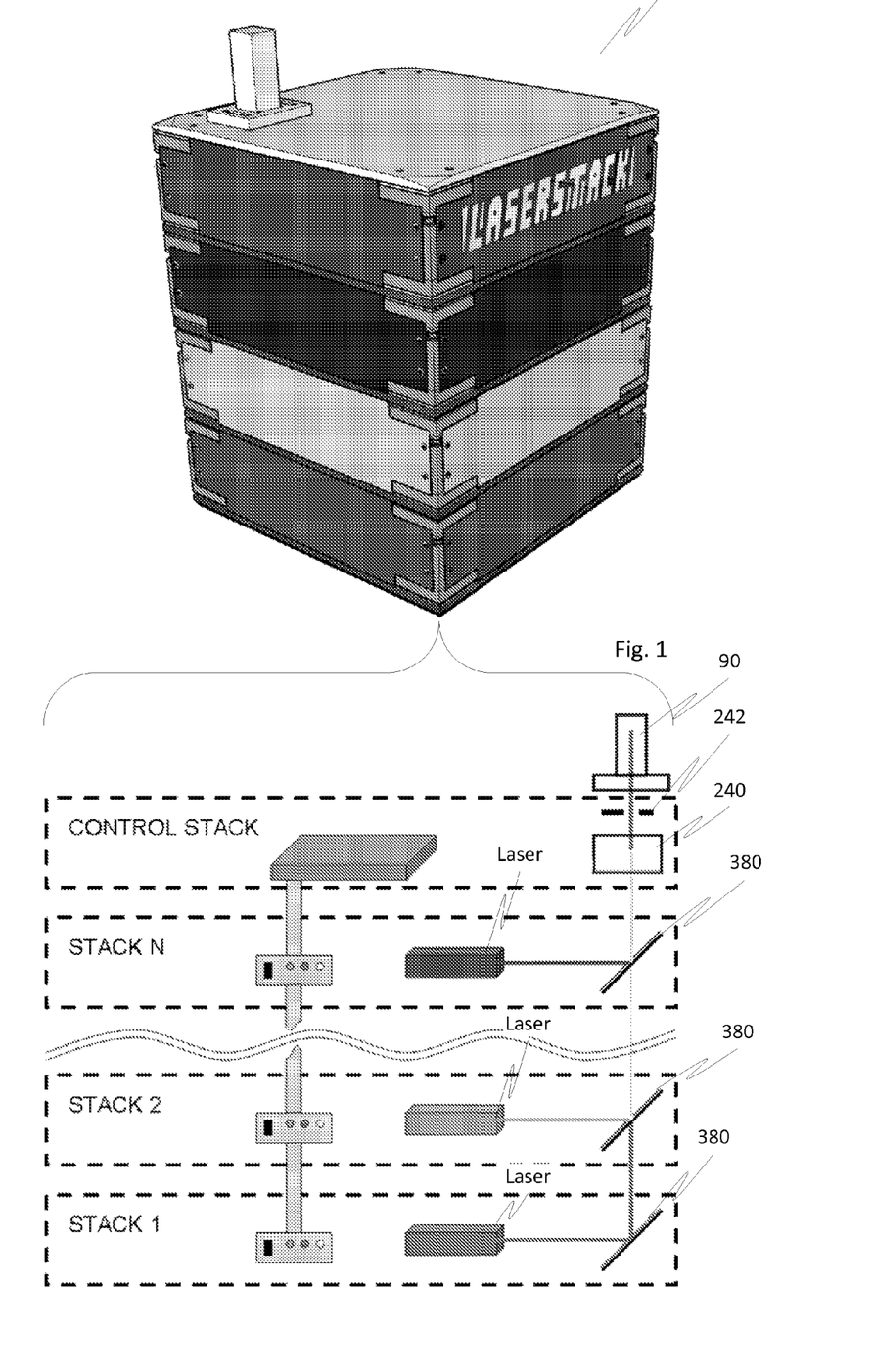
FIG. 1 illustrates an environmental perspective view and functional equivalent view of the exemplary laser system according to this invention.

FIG. 1 illustrates an exemplary embodiment of the laser system 1 according to this invention. The exemplary laser system 1 can be used for such applications as: SDC (Spinning Disk Confocal Imaging), confocal imaging, TIRF (Total Internal Reflection Fluorescence), FLIM (Fluorescence Lifetime Imaging Microscopy), photo activation, photo bleaching, photo ablation, photo wounding, FCS (Fluorescence Correlation Spectroscopy), cytometry, fluorescence imaging, or the like.

In operation, a control module is mechanically associated with one or more laser modules as described in greater detail hereinafter. The outputs of the various laser modules are combined via a beam combiner(s) 380 as the laser is fed up through the stack of modules as illustrated in the inset of FIG. 1.

For example, a first laser originates in stack 1 is combined with the laser from stack 2 with the cooperation of the beam splitter 380 and further combined with the lasers through stack N and output via the tunable filter 240 and laser safety master shutter 242 via the fiber mount 90. The controller stack provides control of the various stacks as well as enables the stack to be daisy-chained together for power, control, and/or cooling. Additionally, status and/or control lights can be placed on each module within the stack to provide an indication of that particular module's operational state.

Figure 2:
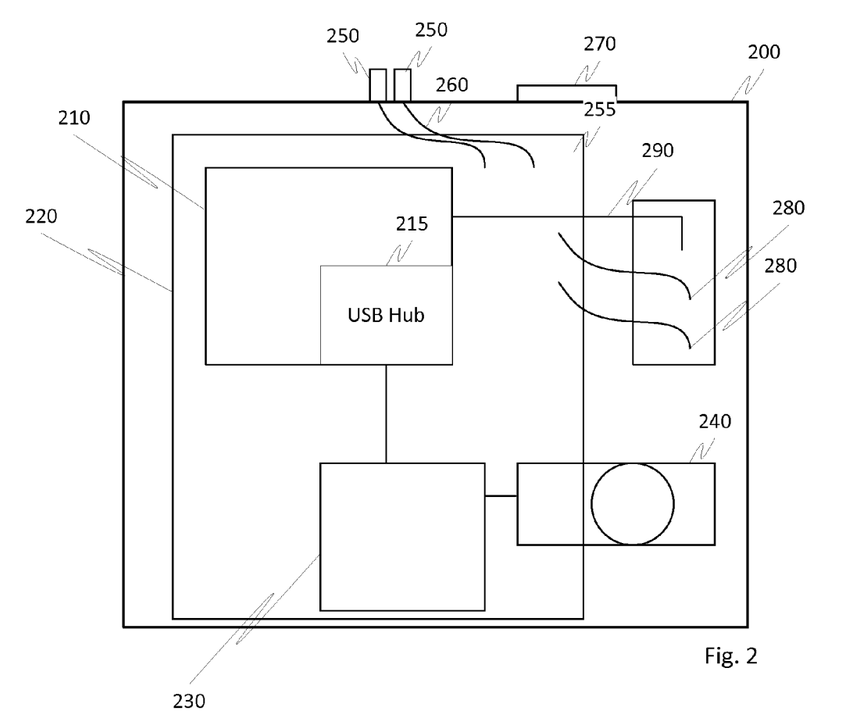
FIG. 2 illustrates an exemplary control module according to this invention.

FIG. 2 illustrates an exemplary control module 200 according to this invention. Control module 200 includes a power supply and controller 210, USB hub 215, cooling mechanism 220 (which may include one or more of a cooling plate or heat sink, fins, cooling tubes, a fan or the like and associated connectors), an Acousto-Optic Tunable Filter (AOTF) controller 230, an acousto-optic tunable filter and optional shutter 240, cooling connectors 250, cooling lines 260, a power connector 270, power and control links 290 and pass-through cooling lines 280. The control module 200 provides control of the output of the laser system 1 through varying one or more of the AOTF 240, shutter and/or power to the various laser modules. The AOTF 240 acts as a shutter in the output laser beam path and is capable of being turned on and off very quickly. The power supply and controller 210 as well as the USB hub 215 allow control of the various laser modules within the laser system. Control commands from the power supply and controller 210 can be sent via link 290 to the various other modules that allow such things as turning on and off, varying of power levels, temperature and/or diagnostics monitoring, and the like. Intensities of the various lasers can be varied by, for example, power regulation, neutral density filter wheels and the like. Control information and various outputs, status indicators and the like can be forwarded to, for example, a display (not shown) and/or regulated through a software application having a graphical user interface.

The cooling connectors 250 and associated lines 260 and 280 allow the laser system to be connected to, for example, an external cooling device, such as those used in personal computer applications. The cooling connectors in cooperation with the cooling lines 260 and 280 allow cooling, such as a cooling fluid, to be passed to a cooling plate 255. The fluid is circulated through the cooling mechanism(s) and out to a pump and cooling mechanism (not shown) that cools the fluid.

Each of the various modules can include a comparable cooling device 220 to help maintain thermal stability amongst the various modules. The coolant can be supplied serially from a first module to the other modules or supplied individually to each module. Furthermore, the cooling need not be done via fluid type coolant but could also be done with air cooling.

The power connector 270 allows the control module to be supplied power from a power source. It should be appreciated however that a power connector 270 could be included on every module as well as associated on/off switches, power indicating lights, and the like.

Figure 3:
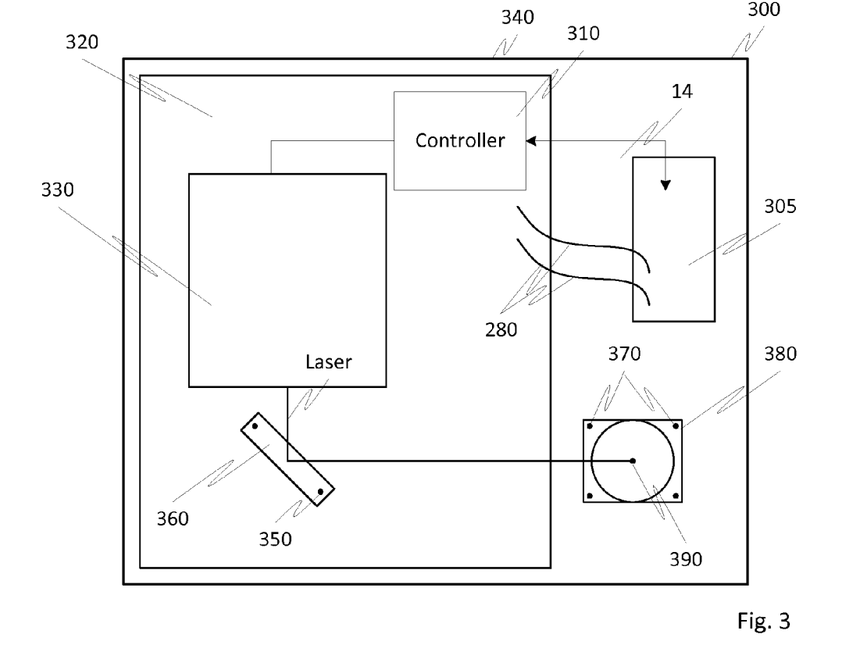
FIG. 3 illustrates an exemplary laser module according to this invention.

FIG. 3 illustrates an exemplary laser module 300. The laser module 300 includes various components mounted on a base plate 14. These components include a controller 310, cooling device 320, laser source 330, mirror 360, mirror adjustment screws 350, a beam combiner 380, combined laser 390, beam combiner adjustment screws 370 and a cable/hose routing port 305 all enclosed in housing 340.

In operation, and at the direction of the controller 310, a laser is emitted from the laser source 330, reflected off of mirror 360 and optionally combined with one or more other upstream lasers at the beam combiner 380 to produce the combined laser 390.

The output of the laser source 330 can be aligned via one or more of the adjustment screws 350 and 370 to align the laser output from the laser module 300. As with the control module 200, the laser module 300 can include a cooling device 320, such as a plate that receives cooling fluid from the coolant lines 280 that can optionally be routed to other modules within the laser system. Intensities of the various laser can be controlled electronically via control signals and/or modulated with an intensity module (that can be placed in a similar housing as the laser module and control modules) and interposed between, for example, two laser modules or between a laser module and a control module. Additionally, an optical switching device could be associated with the system to direct an output, e.g., the combined laser, between 2 or more different output paths, with the switching device optionally including a moving mirror.

With reference to FIGS. 4-10, the construction of an exemplary embodiment of the modules will be discussed with reference to the following components:

| | |
|---|---|
| Base | 26 |
| Base plate | 14 |
| Bracket | 10 |
| Post face | 54 |
| Riser face | 58 |
| Fiber holder | 90 |
| Foot | 34 |
| Head | 22 |
| Laser generator | 18 |
| Laser housing | 6 |
| Laser mount | 74 |
| Mirror mount | 78 |
| Panel | 70 |
| Post | 46 |
| Recess | 66 |
| Riser | 38 |
| Set screw | 30 |
| Stack | 2 |
| Tapped hole | 42 |
| Through hole | 62 |
| Top plate | 86 |
| Top surface | 50 |
| Lower base plate | 82 |

Referring now to FIGS. 4-10, a stack 2 of laser housings 6 is shown that are interconnected by brackets 10. More specifically, the stack 2 is comprised of a plurality of vertically aligned laser housings 6. Each laser housing 6 is comprised generally of a base plate 14 that is spaced from the base plate 14 of an adjacent laser housing by at least one bracket 10. The brackets 10 are designed to secure adjacent laser housings 6 in such a way to allow for the optimum alignment and combination of beams produced by laser generators 18 located in each laser housing 6. The brackets 10 are generally comprised of a riser 38 that is positioned between a head 22 and a base 26. The brackets 10 facilitate interconnection of laser housings 6 and ensure proper alignment of each laser housing 6 in the stack 2.

Figure 4:
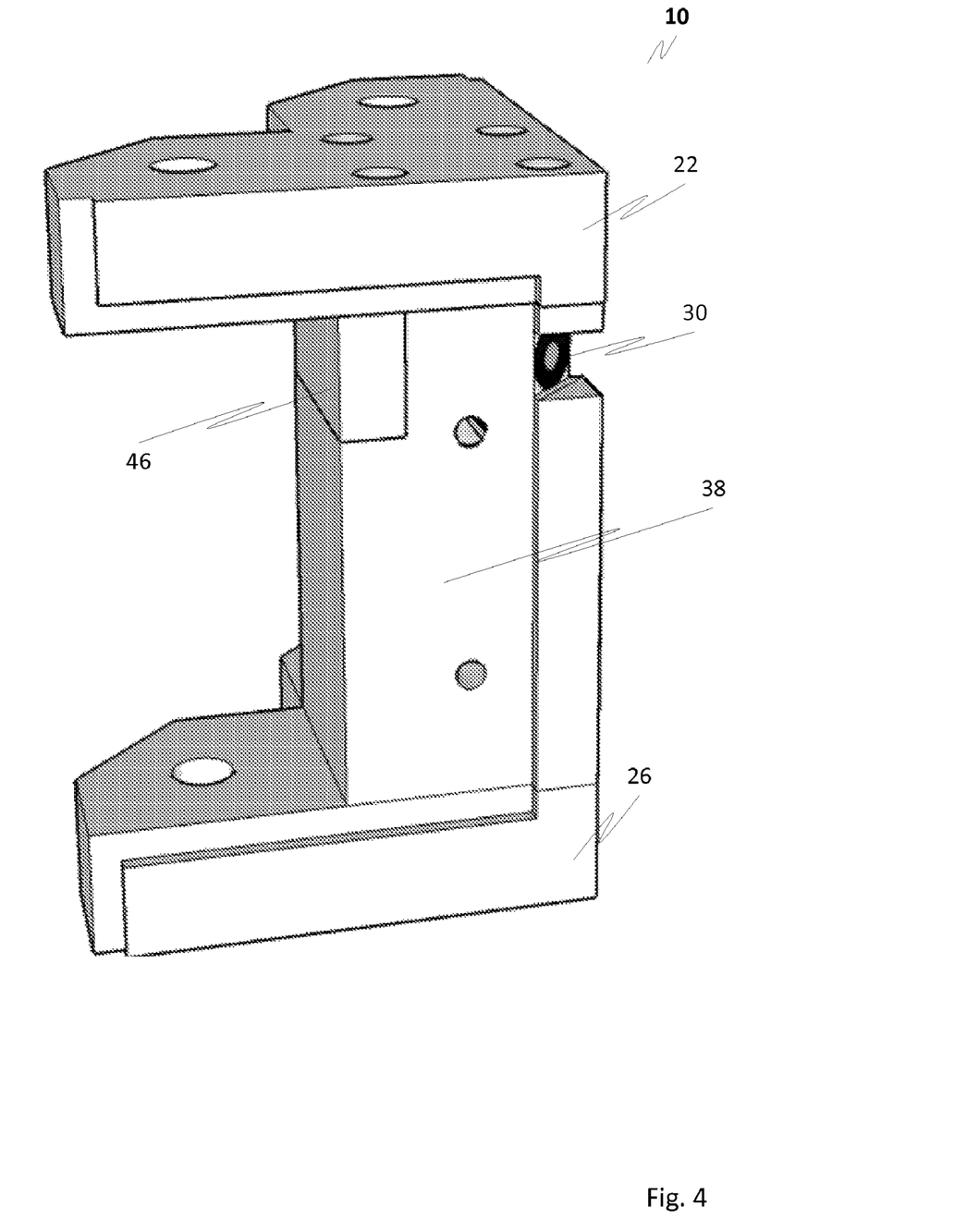
FIG. 4 illustrates a perspective view of a bracket of one embodiments of the present invention.
Figure 5:
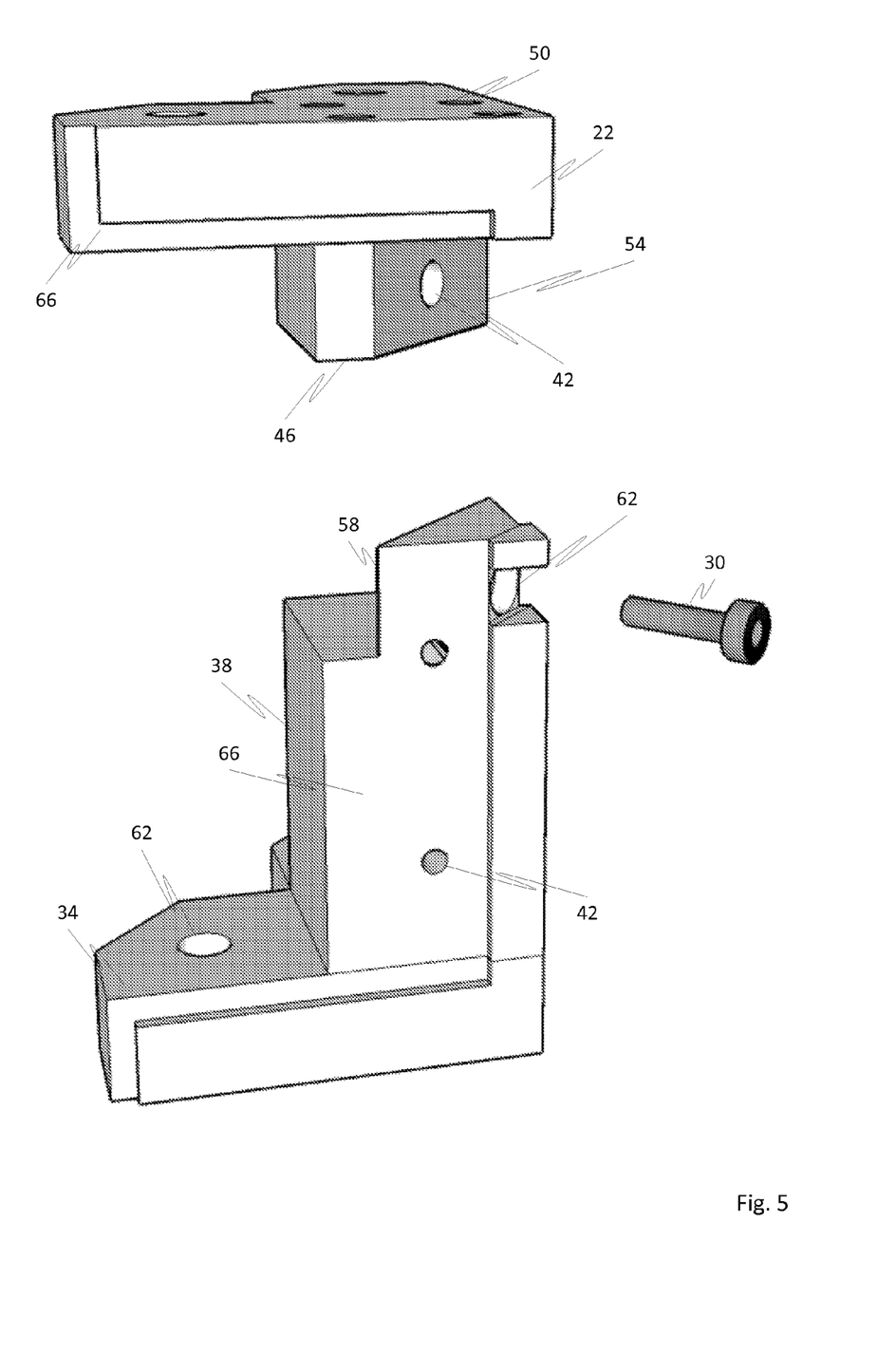
FIG. 5 illustrates an exploded view of the exemplary bracket according to this invention.

Referring now to FIGS. 4 and 5, a bracket of one embodiment of the present invention is shown. The brackets 10 of embodiments of the present invention include the head 22 that is selectively interconnected to the base 26 via the riser 38. The base 26 also includes a foot 34 for engagement onto the base plate 14. The riser 38 and base 26 may be unitary or selectively interconnected to each other. The riser 38 includes a plurality of holes, such as a tapped holes 42, that receive fasteners for interconnection of a panel that forms a side of the laser housing, which will be described in further detail below. The tapped holes 42 may be threaded, or, alternatively, be adapted to receive a threaded insert. The holes may also frictionally or otherwise engage a fastener. The head 22 of the bracket 10 also includes a post 46 extending therefrom. The post 46 and head 22 may be of unitary construction or be selectively interconnected to each other by at least one fastener, for example. The head 22 includes a top surface 50 for engagement onto a bottom surface of the base plate. The post 46 also includes a face 54 that engages a face 58 of the riser 38 to properly position the head 22 with respect to the base 26. That is, the engagement of the post face 54 and the riser face 58 prevents substantial rotation of the head 22 relative to the base 26. Preferably, a set screw 30 is placed through a through hole 62 of the base 26 and threaded into a tapped hole 42 in the post 46 to interconnect the head 22 to the base 26. This interconnection scheme allows the head 22 be disassociated from the riser 38 from the outside of the laser housing. The base 26, the riser 38 and the head 22 may each include a recess 66 for receipt of a panel 70 that defines a sidewall of the laser housing 6, which will be described in further detail with respect to FIG. 7. However, one skilled in the art will appreciate that the panels may simply be interconnected via adhesives, hook and loop fasteners, magnets, etc., to an outer surface of the head 22 of the base 26 and/or the riser 38.

Figure 6:
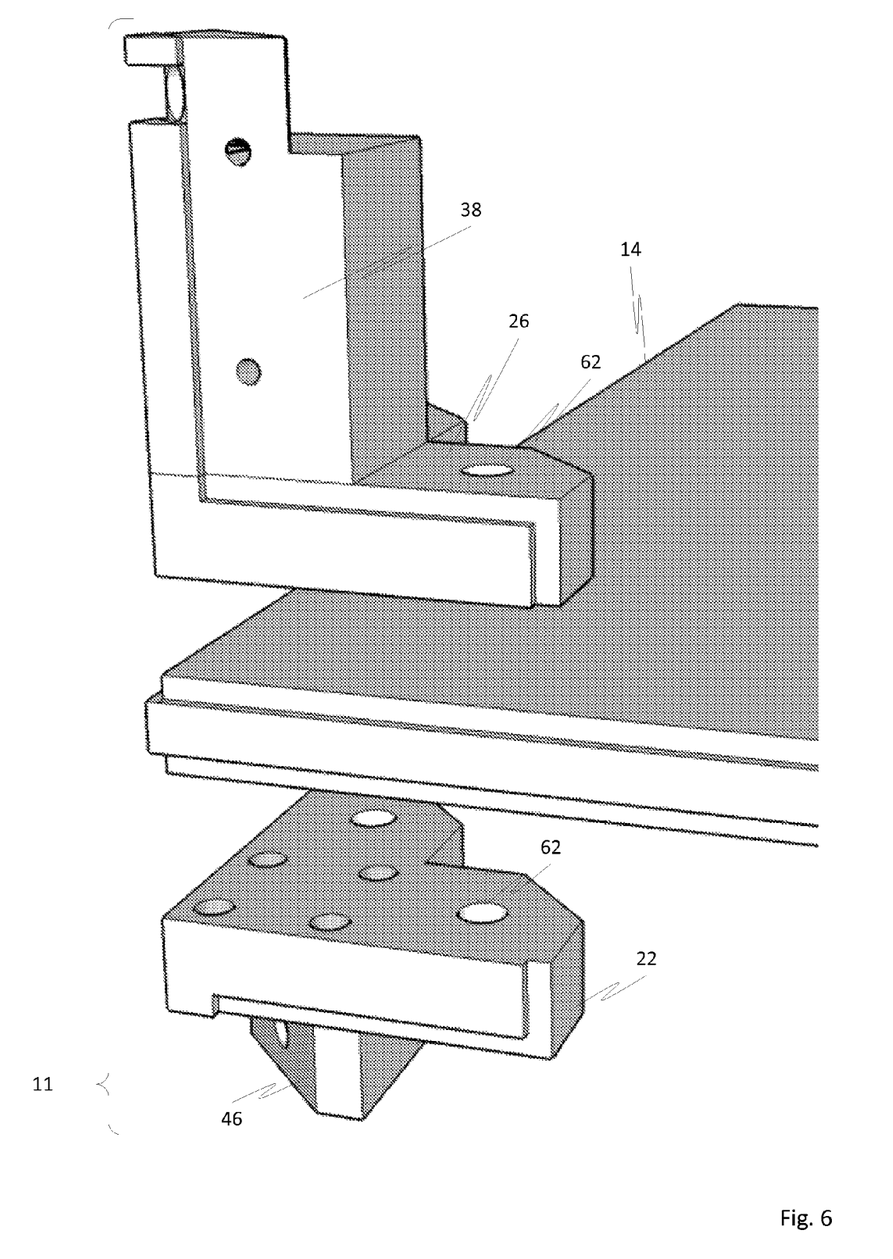
FIG. 6 illustrates a partial perspective view of a base plate that receives a base portion and a head portion of the bracket according to an exemplary embodiment of this invention.
Figure 7:
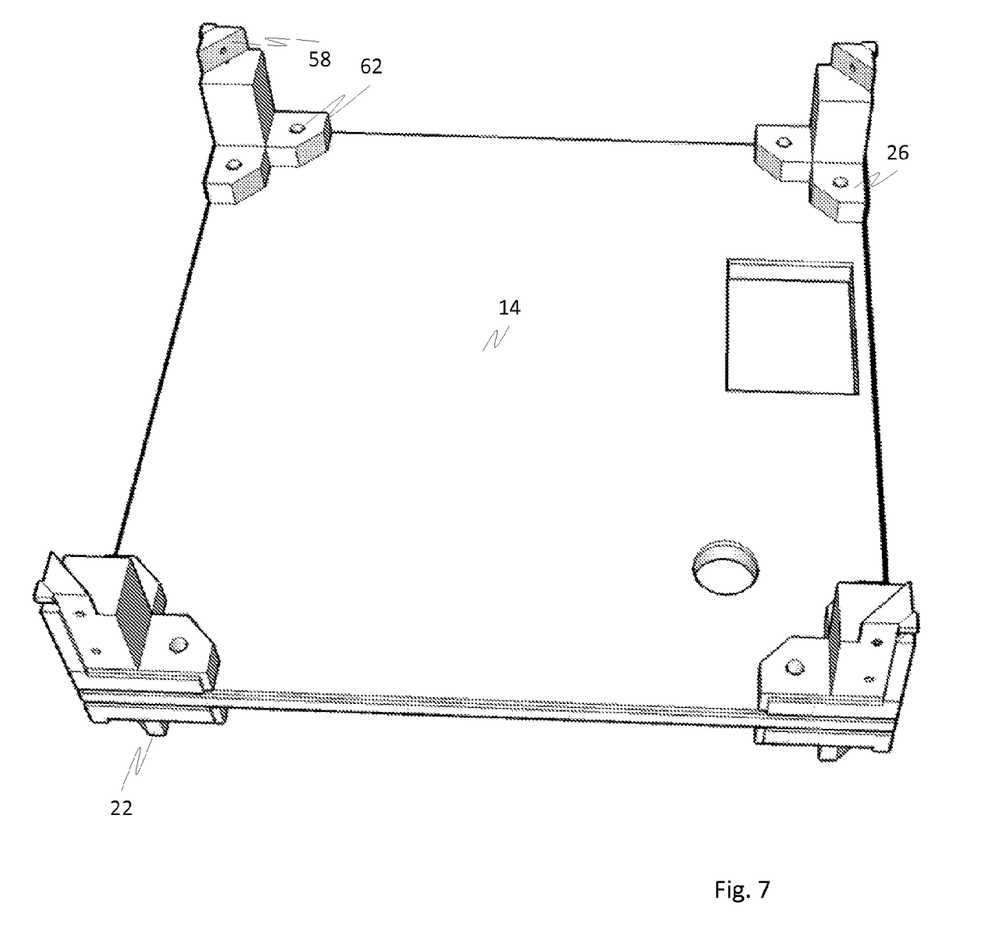
FIG. 7 illustrates a perspective view of the base plate including interconnected bracket bases and heads according to this invention.
Figure 8:
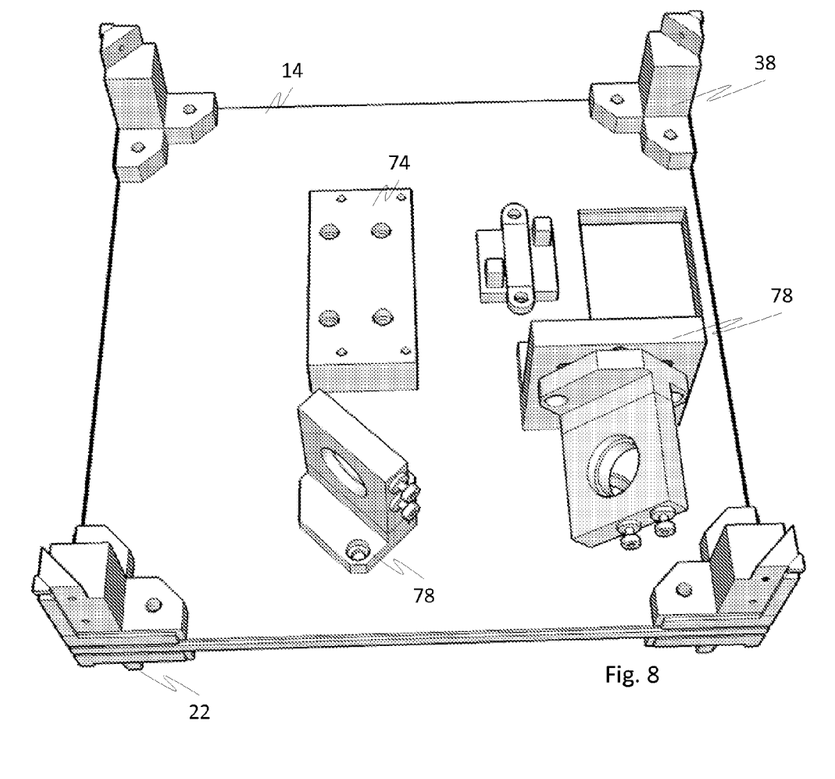
FIG. 8 illustrates a perspective view of the base plate showing the brackets and plurality of mounts attached thereto according to an exemplary embodiment of this invention.
Figure 9:
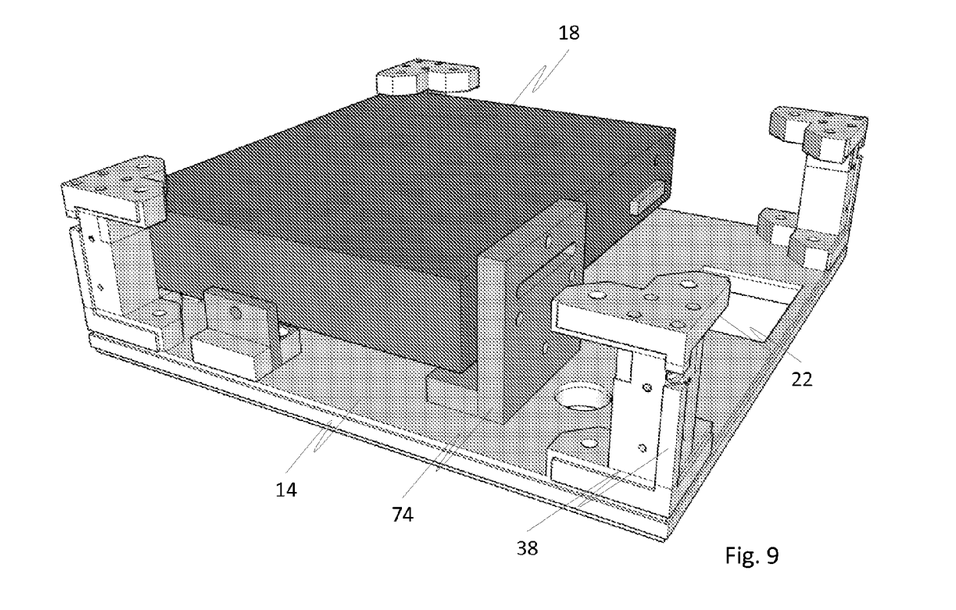
FIG. 9 illustrates an exemplary component view of the control module according to this invention.
Figure 10:
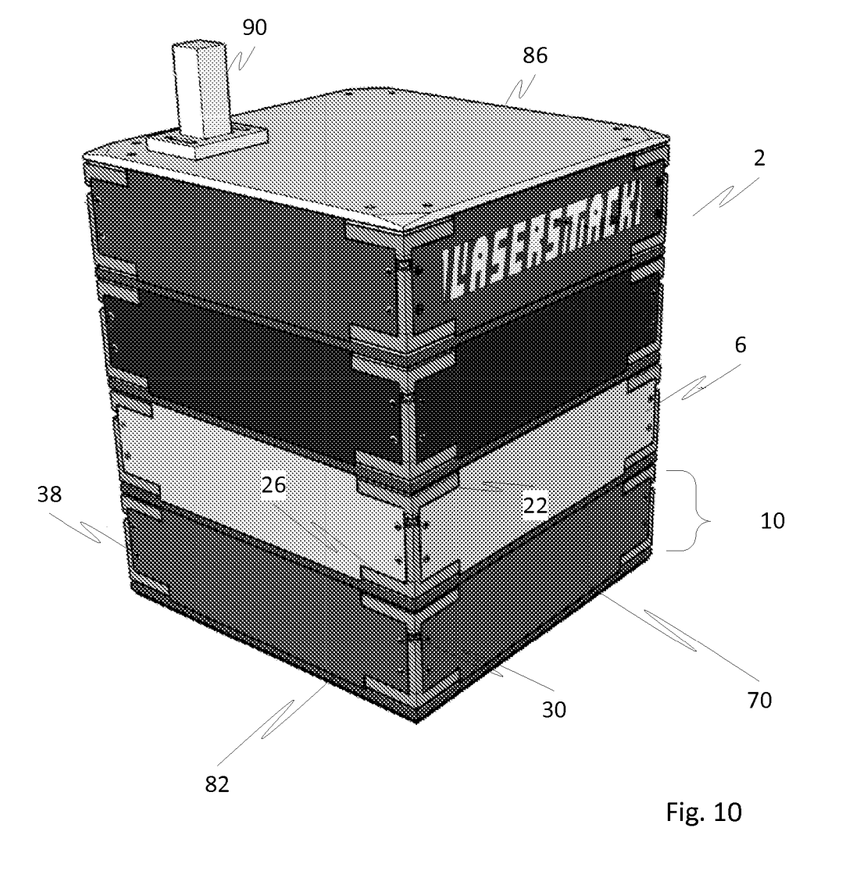
FIG. 10 illustrates another exemplary view of the laser system according to this invention.

Referring additionally now to FIGS. 6 and 7, the base plate 14 is positioned between the base 26 and the head 22 wherein a fastener (not shown) secures the assembly via through holes 62 integrated into each of the bracket portions. It will be appreciated that the post 46 offsets the base plate 14 from a work surface and, thus, allows a user to lift the subassembly 11 comprised of heads 22, bases 26 and risers 38, and the base plate 14. It is contemplated that a plurality of bases/heads/risers be added to the base plate 14 initially wherein laser mounts 74 and mirror mounts 78 are subsequently added to the base plate 14. Finally, the laser 18 would be added to at least one base plate 14 of the stack which is designed to produce a laser beam that is coupled with other laser beams produced in other laser housings of the stack.

Referring now to the figures, the stack 2 is defined by a plurality of vertically interconnected laser housings 6. Initially, a lower base plate 82 would be positioned and a plurality of bracket bases with associated risers 38 interconnected thereto. As shown, the bases 26 positioned adjacent to the corners of the base plate 14. One skilled in the art will appreciate, however, that the bases 26 of any shape are contemplated and that the brackets 10 do not necessarily have to be located at the corners of the base plate 14. It is, however, desirous to locate the brackets 10 on an outside surface of the laser housing so that the set screws 30 are located in such a way to facilitate assembly of the stack 2. A subassembly 11 with associated heads 22 on one side of the base plate 14 and bracket bases 26 on another side, of the base plate 14, would then be positioned atop the risers 38 associated with the lower base plate 82. The heads 22 of the subassembly 11 are then interconnected to the risers 38 associated with the lower base plate 82 as shown in FIGS. 4 and 5. A plurality of set screws 30 would then be used to firmly interconnect the heads, via the posts, to the risers 38. As shown, a hex headed set screw is provided. One skilled in the art will appreciate that other types of fasteners may be used equally well. Additional subassemblies 11 are added as needed to form the completed stack 2. Finally, a plurality of panels 70 are interconnected to the brackets 10 by way of fasteners (not shown) that engage the tapped holes provided in the bracket 10. Preferably, the panels 70 are recessed into the bracket 10 such that they are flush with a top plate 86 and base plates 14, 82 of each laser housing 6. The panels 70 may be interconnected alternatively to the bracket 10 via adhesives, hook and loop fasteners, magnets or any other selective interconnection technique. To complete the assembly of fiber holder 90 may be interconnected to the top plate 86. One skilled in the art will appreciate that the brackets 10 may also include lifting devices associated therewith to help position the completed stack. Likewise, other means of securing the head relative to the riser could be used such as a post and receiving aperture, kinematic mounts, direct fastening of the stacks together, the use of a matched base and top plates and interconnects that allow the stacks to be positioned horizontally.

Referring again to FIGS. 4 and 5, the brackets 10 of embodiments of the present invention are made of machined metal. One skilled in the art, however, will appreciate that other materials, such as composites may be employed without departing from the scope of the invention. It is desirous to provide a bracket 10 that is less prone to thermal expansions, thereby reducing the risk of laser and/or mirror misalignments during heating and cooling of the stack 2. The head 22 portion of the bracket 10 as described above, employs the post 46 interconnected thereto. Preferably, a series of set screws 30 are used to interconnect the head 22 to the post 46. One skilled in the art will appreciate that the head 22/post 46 may be a unitary component. Similarly, the riser 38 may be interconnected to the base 26 by way of a plurality of set screws. These components may also be formed of one-piece construction. The riser 38 may be of any length and of any shape. Preferably, the interconnected post 46 and riser 38 have a prismatic shape to facilitate angular alignments of adjacent laser housings 6.

The exemplary techniques illustrated herein are not limited to the specifically illustrated embodiments but can also be utilized with the other exemplary embodiments and each described feature is individually and separately claimable.

The systems of this invention can cooperate and interface with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device such as PLD, PLA, FPGA, PAL, any comparable means, or the like.

Furthermore, the disclosed control methods and graphical user interfaces may be readily implemented in software using object or object-oriented software development environments that provide portable source code that can be used on a variety of computer or workstation platforms. Alternatively, the disclosed control methods may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized.

It is therefore apparent that there has been provided, in accordance with the present invention, a laser system. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A modular laser combiner system comprising:
 one or more laser modules with different wavelength outputs, each laser module including a beam combiner;
 means for controlling a resultant output of a combined laser beam by one or more of turning on/off specific laser lines and attenuating specific laser lines; and
 a mechanical assembly adapted to align the modules relative to one another and hold them rigid.

2. The system of claim 1, further comprising a respective adjustment mechanism to steer each laser with respect to other lasers for alignment.

3. The system of claim 1, further comprising a controller adapted to control the intensity of individual beams in the one or more laser modules by one or more of turning them off and on and attenuating the beams.

4. The system of claim 1, further comprising a fiber output.

5. The system of claim 1, further comprising a cooling system.

6. The system of claim 1, wherein the laser modules include a solid-state laser.

7. The system of claim 2, wherein the adjustment mechanism comprises one or more mirrors in mechanically adjustable mounts.

8. The system of claim 1, further including a mechanical shutter.

9. The system of claim 1, further including a neutral density intensity modulating filter wheel.

10. The system of claim 1, wherein the means for controlling the resultant output includes an acousto-optical tunable filter.

11. The system of claim 1, wherein where the acousto-optical tunable filter is a poly-chromatic acousto-optic modulator.

12. The system of claim 1, wherein laser intensities are variable by direct electronic control of the laser modules by one or more of electronic signaling and digital or serial commands via an interface.

13. The system of claim 1, further comprising an intensity module adapted to control laser intensity placed between two laser modules or between a laser module and a control module.

14. The system of claim 1, wherein the one or more laser modules may be added or removed from the laser combiner system without re-alignment of the system.

15. The system of claim 1, further comprising an optical switching device adapted to direct an output between 2 or more different output paths.

16. The system of claim 15, wherein the switching device includes a moving mirror.

17. The system of claim 1, wherein subassemblies maintain an alignment between the one or more lasers and other modules.

18. The system of claim 17, wherein each subassembly includes a head and a riser.

19. The system of claim 18, wherein the head and the riser secure adjacent laser housings.

20. The system of claim 18, wherein the head and riser provide laser alignment between one or more modules.

21. The system of claim 10, wherein the means for controlling the resultant output includes an acousto optical modulator.

22. The system of claim 15, wherein the means for controlling the resultant output includes a polarizing beamsplitter.

23. The system of claim 17, wherein a housing for each module is rigid and joins individual modules together and rigid with respect to each other.

24. The system of claim 1, wherein the mechanical assembly includes a separate large base to which all individual modules attach.

25. The system of claim 1, wherein there are at least two laser modules, one of the laser modules including a broad-band output laser with an output of at least 50 nm wide.

26. The system of claim 25, wherein the broad-band output laser is a super-continuum laser.

27. The system of claim 25, wherein the output of the broad-band output laser is controlled by means of individual color filters.

28. The system of claim 25, wherein the output of the broad-band output laser is controlled by means of an acousto-optical tunable filter or polychromatic filter.

29. The system of claim 1, wherein the means for controlling the resultant output includes a color filter that varies its properties with angle.

* * * * *